(12) United States Patent
Cobb

(10) Patent No.: US 8,599,485 B1
(45) Date of Patent: Dec. 3, 2013

(54) SINGLE-EMITTER ETENDUE ASPECT RATIO SCALER

(75) Inventor: Joshua Monroe Cobb, Victor, NY (US)

(73) Assignee: Corning Incorporated, Corning, NY (US)

( * ) Notice: Subject to any disclaimer, the term of this patent is extended or adjusted under 35 U.S.C. 154(b) by 42 days.

(21) Appl. No.: 13/480,883

(22) Filed: May 25, 2012

(51) Int. Cl.
G02B 27/14 (2006.01)
G02B 27/10 (2006.01)
G02B 27/30 (2006.01)

(52) U.S. Cl.
USPC .......................... 359/629; 359/618; 359/641

(58) Field of Classification Search
USPC .......................... 359/629, 631, 618, 619, 641
See application file for complete search history.

(56) References Cited

U.S. PATENT DOCUMENTS

| | | |
|---|---|---|
| 4,993,812 A | 2/1991 | Matsuoka et al. |
| 5,243,619 A | 9/1993 | Albers et al. |
| 5,513,201 A | 4/1996 | Yamaguchi et al. |
| 5,583,683 A | 12/1996 | Scobey |
| 5,745,153 A | 4/1998 | Kessler et al. |
| 5,786,915 A | 7/1998 | Scobey |
| 5,825,551 A | 10/1998 | Clarkson et al. |
| 6,167,171 A | 12/2000 | Grasis et al. |
| 6,198,857 B1 | 3/2001 | Grasis et al. |
| 6,324,190 B1 | 11/2001 | Du et al. |
| 6,377,599 B1 | 4/2002 | Marshall |
| 6,819,402 B2 | 11/2004 | Augustyn et al. |
| 7,065,105 B2 | 6/2006 | Ehlers et al. |
| 7,218,451 B2 | 5/2007 | Lee et al. |
| 7,495,838 B2 * | 2/2009 | Krneta et al. ................ 359/641 |
| 7,515,346 B2 * | 4/2009 | Govorkov et al. ............ 359/641 |
| 7,520,641 B2 | 4/2009 | Minano et al. |
| 7,537,395 B2 | 5/2009 | Savage-Leuchs |
| 7,697,207 B2 * | 4/2010 | Govorkov et al. ............ 359/618 |
| 7,762,465 B2 | 7/2010 | Knowles et al. |
| 7,764,723 B2 | 7/2010 | Ovtchinnikov et al. |
| 7,822,304 B2 | 10/2010 | Hirata |
| 7,830,608 B2 | 11/2010 | Hu et al. |

(Continued)

FOREIGN PATENT DOCUMENTS

| | | |
|---|---|---|
| DE | 3929794 | 4/1991 |
| DE | 10328084 | 1/2005 |
| DE | 102006050155 | 4/2008 |

OTHER PUBLICATIONS

Sep. 20, 2012 International Search Report of related application PCT/US12/39919.

(Continued)

*Primary Examiner* — Mohammed Hasan
(74) *Attorney, Agent, or Firm* — Svetlana Short

(57) ABSTRACT

An apparatus emits a laser light beam with a first aspect ratio of etendue $R_1$, wherein the optical invariant with respect to a first direction is less than half the optical invariant with respect to a second orthogonal direction. A first cylindrical lens collimates the beam in the first direction. A second cylindrical lens collimates the light beam in the second direction. A bisecting reflective surface has an edge that splits the collimated beam into undeviated and first deviated beam paths. A folding reflective surface redirects the first deviated beam path back toward the bisecting reflective surface, optically parallel with and displaced from the undeviated beam path with respect to the first direction. At least a portion of the redirected first deviated beam path passes the edge and combines with the undeviated path to form an output beam having a second aspect ratio of etendue $R_2$ not equal to $R_1$.

20 Claims, 16 Drawing Sheets

(56) References Cited

U.S. PATENT DOCUMENTS

| | | |
|---|---|---|
| 2004/0067016 A1 | 4/2004 | Anikitchev et al. |
| 2004/0252744 A1 | 12/2004 | Anikitchev et al. |
| 2005/0088654 A1 | 4/2005 | Hu et al. |
| 2006/0182155 A1 | 8/2006 | Windpassinger et al. |
| 2007/0268946 A1 | 11/2007 | Schulte et al. |
| 2012/0307370 A1 | 12/2012 | Bhatia et al. |

OTHER PUBLICATIONS

Jun. 19, 2013 Invitation to Pay Additional Fees and Partial International Search issued in related application PCT/2013/026815.

S. Zhan et al., "Eliminating dead spaces of the laser diode stack in the fast-axis direction using a plane-parallel plate array" Optical Engineering, Sep. 2007, vol. 46(9), pp. 094203-1 to -5.

W.A. Clarkson et al., "Novel Beam Shaping Technique for High Power Diode Bars" Optoelectronics Research Centre, University of Southhampton. Research paper, CLEO '94, Anaheim CA, May 8-13 (1994) vol. 8, pp. 360.

W.A. Clarkson et al., "Two-mirror beam-shaping technique for high-power diode bars", Optics Letters, vol. 21 No. 6, Mar. 15, 1996, pp. 375-377.

\* cited by examiner

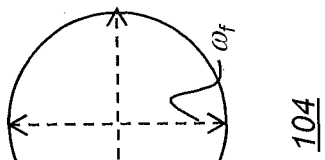
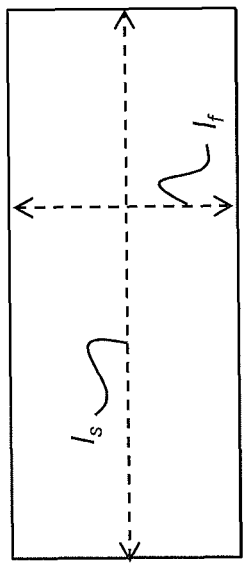
FIG. 1B
(Prior Art)

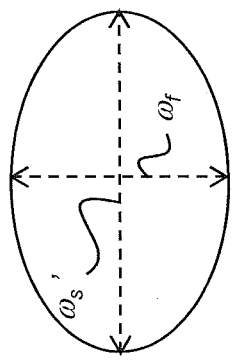
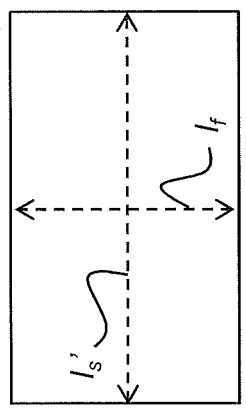
FIG. 1C
(Prior Art)

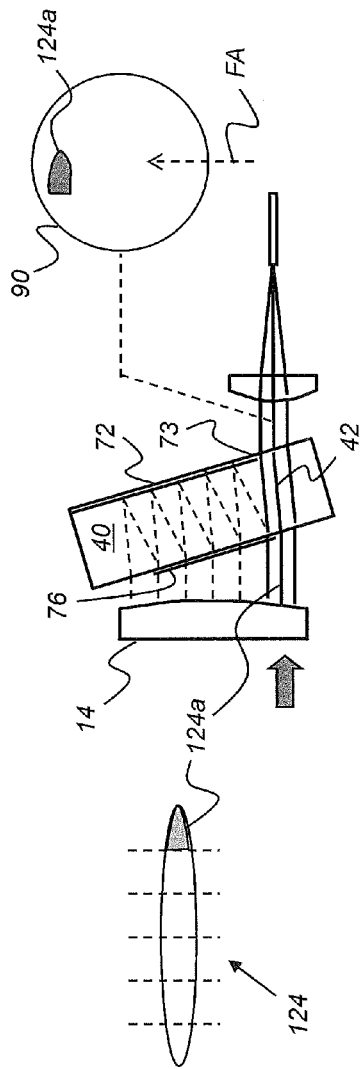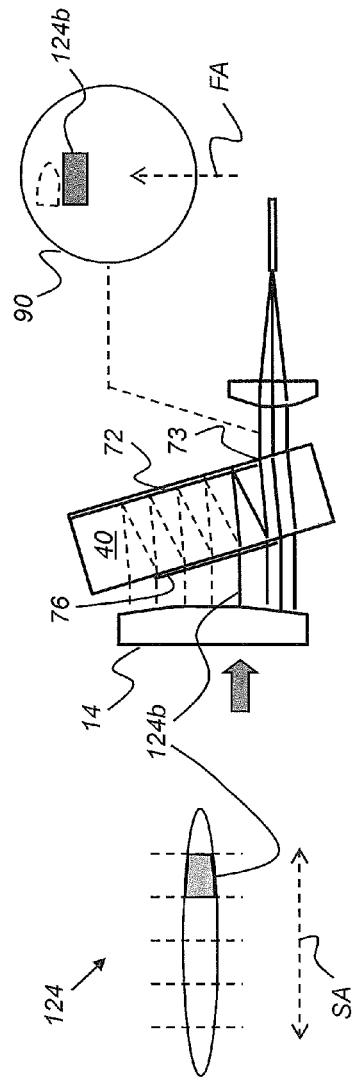

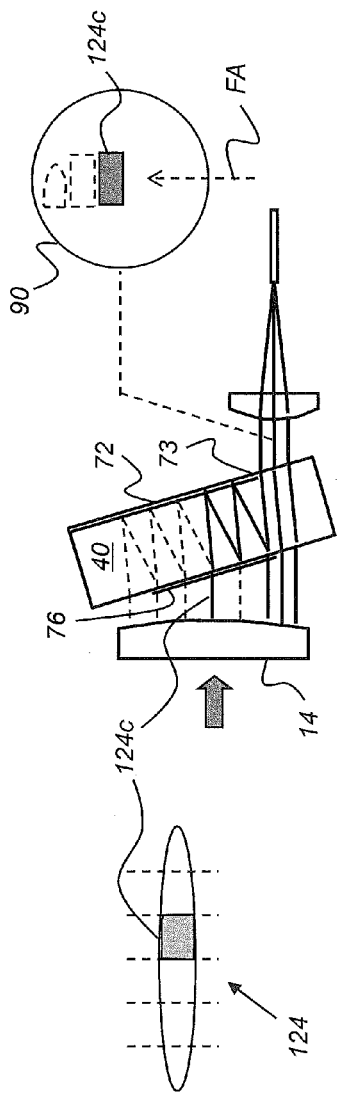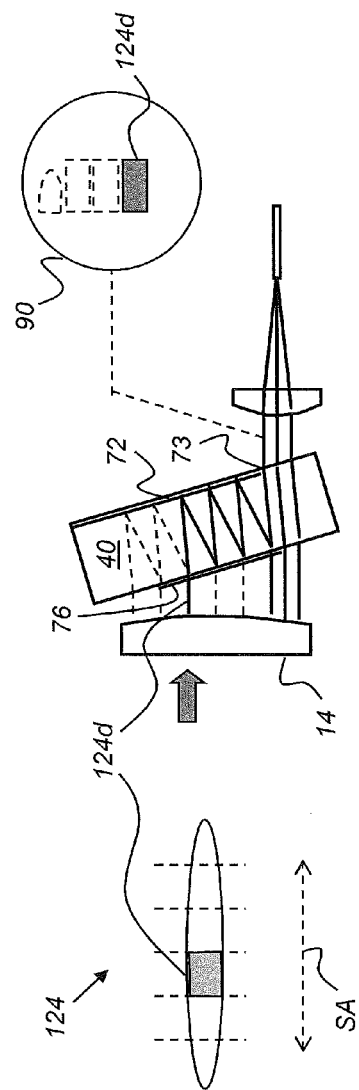
FIG. 8C
FIG. 8D

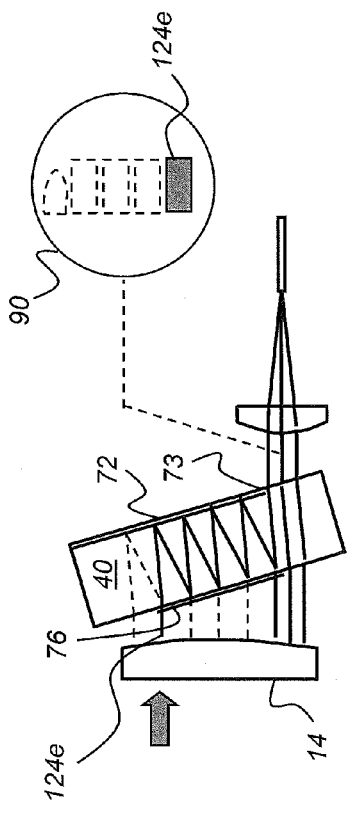
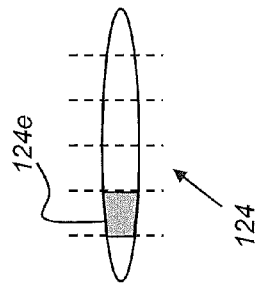
FIG. 8E
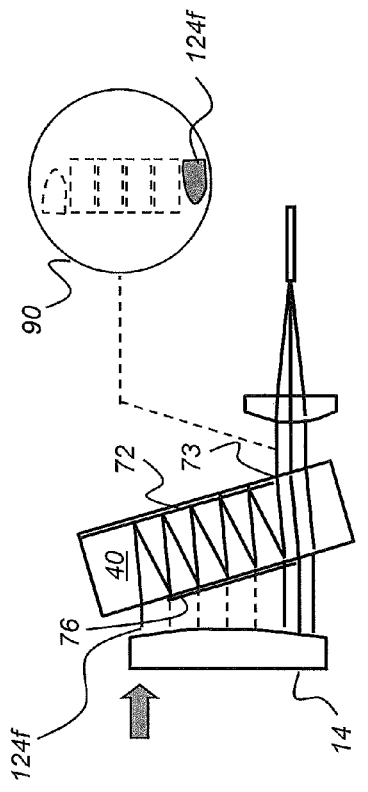
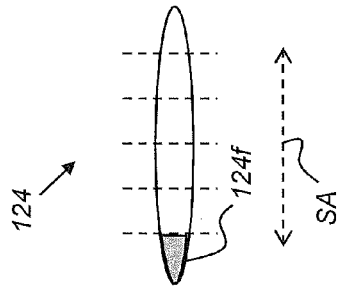
FIG. 8F

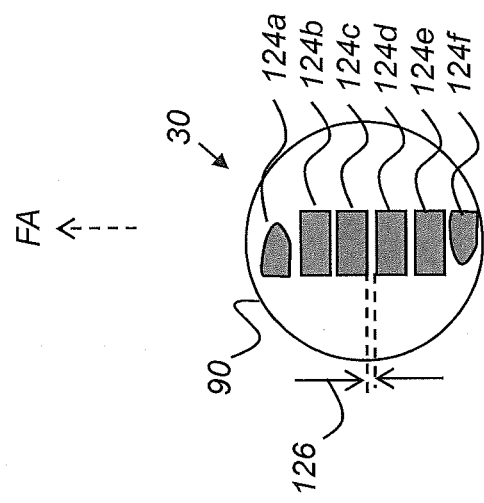
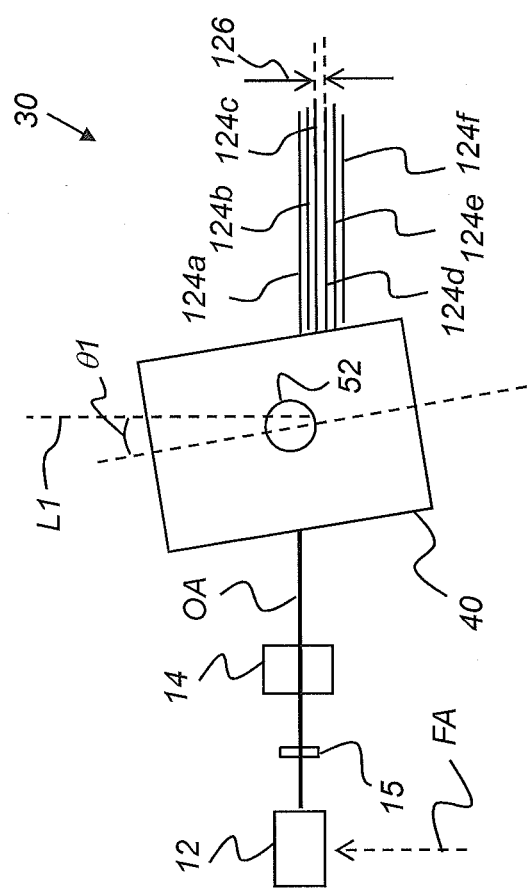

SINGLE-EMITTER ETENDUE ASPECT RATIO SCALER

CROSS-REFERENCE TO RELATED APPLICATIONS

The present invention is related to commonly assigned U.S. patent application Ser. No. 13/118,939 entitled "METHOD AND APPARATUS FOR COMBINING LIGHT SOURCES IN A PUMP LASER ARRAY" in the name of Josh Cobb, filed May 31, 2011 and to commonly assigned U.S. patent application Ser. No. 13/401,196 entitled "METHOD AND APPARATUS FOR COMBINING LASER ARRAY LIGHT SOURCES" in the name of Josh Cobb, filed Feb. 21, 2012.

FIELD OF THE INVENTION

This invention generally relates to optical apparatus that generate laser light and more particularly relates to apparatus and methods for conditioning the etendue of light emitted from a solid-state laser source.

BACKGROUND

Laser diodes are solid-state emissive devices employed in a broad range of applications where highly coherent light is useful. While laser diodes offer a number of advantages for size, cost, and performance, however, these devices do not provide an output beam that is well-suited for use with systems that handle rotationally symmetric light, such as optical apparatus that use conventional spherical optics. The output beam of the laser diode, when considered in cross-section, has an aspect ratio that is highly asymmetric, with markedly different divergence angles in respectively orthogonal directions. The output beam emits from a wide stripe which extends along a "slow" axis to a width dimension that is several times its height along a "fast" axis that is orthogonal to the slow axis. Rotationally symmetric optics, meanwhile, are optimized for handling light beams that are themselves substantially symmetric. Thus, adapting the light from a laser diode or laser diode array to a spherical optical system can require components and techniques for rearranging the distribution of the light, such as by stacking beams of multiple lasers along the fast width, for example, to form a composite beam that has a more symmetric aspect ratio.

The innate asymmetry of the laser diode light is particularly disadvantageous for use with optical fibers. The highly symmetric input aperture of the optical fiber is poorly matched to the aspect ratio of the laser diode output beam, making it difficult to design an efficient optical system that can use all of the light output. In effect, when using light from a single laser diode, the input aperture of the optical fiber is readily over-filled in one direction and under-filled in the orthogonal direction.

One result of this innate incompatibility between the laser diode and optical fibers is that it imposes constraints on laser diode design. Laser diodes that are used to provide pump excitation light for fiber lasers, for example, are constrained in emitting stripe width, with an emitter width that is nominally no more than about 100 μm. Emitters having a wider stripe width, such as diodes with an emitter stripe width of 120 μm or longer, have been described and would be more efficient and provide proportionately more light. However, due to output beam geometry, the emitted energy in the slow axis direction would well exceed the input NA of the optical fiber in one direction (slow axis), while still under-filling the aperture in the orthogonal (fast axis) direction.

Thus, it can be appreciated that there is a need for a solution that rearranges the light output of a solid-state laser diode so that it is more compatible with symmetric optics and is better suited for efficient use with optical fibers.

SUMMARY

It is an object of the present invention to advance the art of laser beam light handling and application. With this object in mind, the present disclosure provides an apparatus for providing a light beam comprising:
a) a solid-state laser that is energizable to emit, along an optical axis, an input laser light beam that has a first aspect ratio of etendue R1, wherein the optical invariant of the input laser light beam with respect to a first direction is less than half the optical invariant of the input laser light beam with respect to a second direction that is orthogonal to the first direction;
b) a first cylindrical lens that is disposed to collimate the input laser light beam with respect to the first direction;
c) a second cylindrical lens that is disposed to collimate the input laser light beam with respect to the second direction;
d) a bisecting reflective surface having an edge that extends along the first direction and that is disposed along the optical axis to split the collimated laser light beam with respect to the second direction, into an undeviated beam path from light on one side of the edge, and a first deviated beam path from light on the other side of the edge, wherein the undeviated and first deviated beam paths each contain emitted light from the solid-state laser; and
e) a folding reflective surface disposed to redirect the first deviated beam path back toward the bisecting reflective surface, so that the redirected first deviated beam path is optically parallel with the undeviated beam path and is displaced from the undeviated beam path with respect to the first direction,
wherein at least a first portion of the redirected first deviated beam path passes the edge and combines with the undeviated beam path to form an output beam having a second aspect ratio of etendue $R_2$ that is not equal to $R_1$.

An advantage provided by the present invention is the capability to change the aspect ratio of the etendue for an individual light beam generated from a single laser source. This enables improvements for using light from laser diodes more efficiently and can also offer advantages for easier alignment of a laser diode beam, such as those used to provide light for pumped lasers.

Other desirable objectives, features, and advantages of the disclosed invention may occur or become apparent to those skilled in the art. The invention is defined by the appended claims.

BRIEF DESCRIPTION OF THE DRAWINGS

FIG. 1B is a plan view schematic diagram showing spatial and angular distribution for a light source with a given aspect ratio of etendue.

FIG. 1C is a plan view schematic diagram showing changes to spatial and angular distribution for a light source with magnification along one axis.

FIG. 8A is a top schematic view that shows how a portion of an emitted beam is split into segments and rearranged to form an output beam according to an embodiment of the present invention.

FIGS. 8B, 8C, 8D, 8E, and 8F are top schematic views that continue the light-splitting and rearrangement begun in FIG. 8A and show the light paths for subsequent portions of the emitted laser light.

FIG. 10A is a side view schematic diagram that shows a tilt position for one gap distance.

FIG. 10B is a plan view of an output beam with the gap distance in the example of FIG. 10A.

DETAILED DESCRIPTION

Figure 1A:
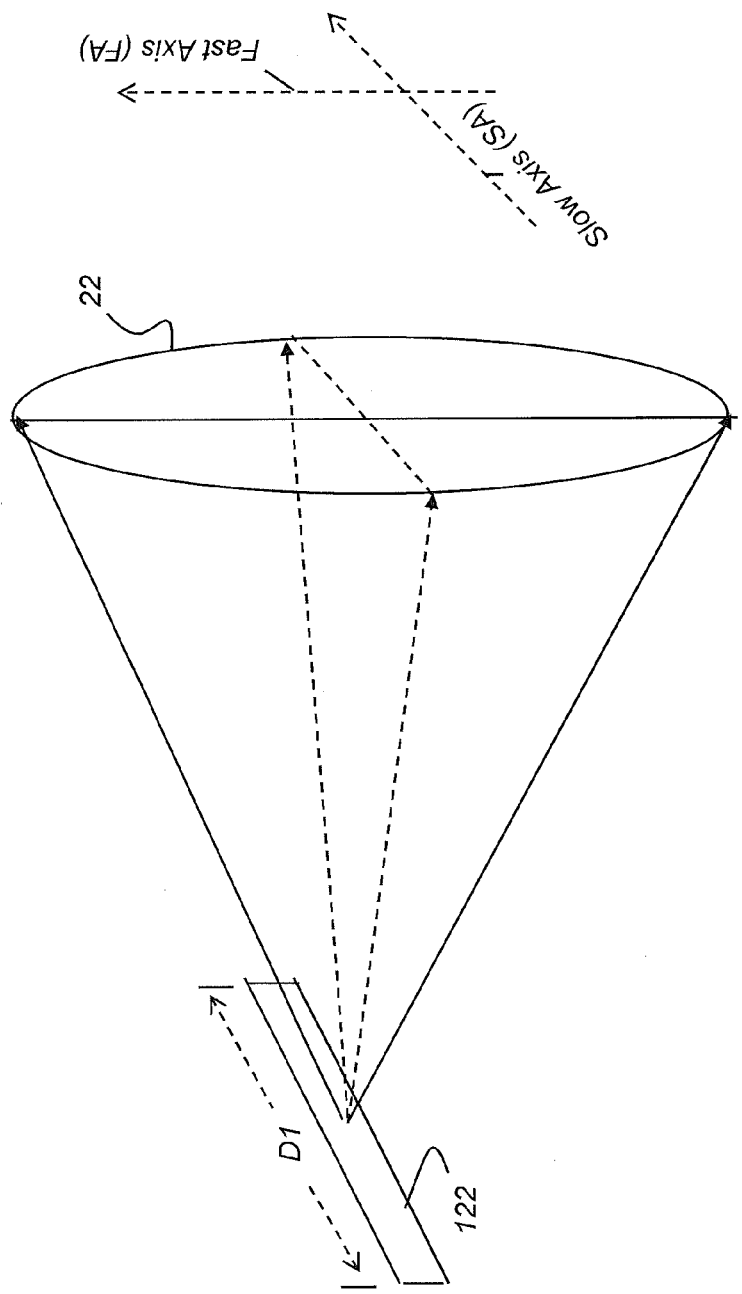
FIG. 1A is a schematic diagram that shows the asymmetry of the laser diode output beam.

Figures shown and described herein are provided in order to illustrate key principles of operation and fabrication for an optical apparatus according to various embodiments and a number of these figures are not drawn with intent to show actual size or scale. Some exaggeration may be necessary in order to emphasize basic structural relationships or principles of operation.

In the context of the present disclosure, terms "top" and "bottom" or "above" and "below" are relative and do not indicate any necessary orientation of a component or surface, but are used simply to refer to and distinguish opposite surfaces or different light paths within a component or block of material. Similarly, terms "horizontal" and "vertical" may be used relative to the figures, to describe the relative orthogonal relationship of components or light in different planes, for example, but do not indicate any required orientation of components with respect to true horizontal and vertical orientation.

Where they are used, the terms "first", "second", "third", and so on, do not necessarily denote any ordinal or priority relation, but are used for more clearly distinguishing one element or time interval from another. For example, there are no fixed "first" or "second" elements in what is taught herein; these descriptors are merely used to clearly distinguish one element from another similar element in the context of the present disclosure.

As used herein, the term "energizable" relates to a device or set of components that perform an indicated function upon receiving power and, optionally, upon receiving an enabling signal.

In the context of the present disclosure, two planes, direction vectors, or other geometric features are considered to be substantially orthogonal when their actual or projected angle of intersection is within +/−2 degrees of 90 degrees. In the context of the present disclosure, the term "bisect" is used to denote separating a light beam into two portions, each portion traveling along a different beam path; this is a less formal use of the term "bisect" than is applied in geometry proofs and does not necessarily imply that the two portions of the split beam are of equal size. In the context of the present invention, for some embodiments, it can be generally useful to bisect the beam from a laser light source into two portions so that each portion is approximately half of the beam, but even a difference of 10% or even of 25-30% or more between two portions would still prove workable and can be advantageous. Thus, each of the two portions of the split light beam that is formed when it encounters a bisecting edge according to embodiments of the present invention will have at least some percentage of the light from the same solid-state laser light source. Still other embodiments bisect a beam to split it into two portions of unequal size, and repeat this process, effectively bisecting the beam multiple times as described in more detail subsequently.

The beam aspect ratio is considered as it would be generally understood to those skilled in the optical arts, that is, considered orthogonally relative to the central axis of the light beam or in the plane perpendicular to the propagation direction.

In the context of the present invention, a surface considered to "reflect" or to be reflective at a certain wavelength reflects at least about 95% of incident light of that wavelength. A surface considered to "transmit" or to be transmissive at a certain wavelength transmits at least about 80% of incident light of that wavelength.

In the context of the present invention, the term "oblique" or phrase "oblique angle" is used to mean a non-normal angle that is slanted so that it differs from normal, that is, differs from 90 degrees or from an integer multiple of 90 degrees, by at least about 2 degrees or more along at least one axis. For example, an oblique angle may be at least about 2 degrees greater than or less than 90 degrees using this general definition.

In the context of the present invention, a "composite beam" is formed from a set of two or more individual "component beams". Two light paths are considered to be "optically parallel" when they travel in the same direction within the same refractive component or medium, so that corresponding segments of two optically parallel light paths, when both path segments extend within the same refractive medium, are geometrically parallel to each other. Paths that are optically parallel can also be considered to be piece-wise parallel for corresponding segments that are within the same transparent medium.

According to a broad aspect of the present invention, apparatus and methods are provided that enable changing the aspect ratio of the etendue of a light beam that is emitted from a single light source. Advantageously, embodiments of the present invention provide apparatus and methods for providing laser pump light for a fiber laser or other type of laser as a light beam from a single laser source. Alternate embodiments of the present invention may also serve to condition a light beam in other environments where it is advantageous to be able to adjust the aspect ratio of the etendue of the light beam.

In order to better understand what is meant by the phrase "aspect ratio of the etendue", it is useful to more clearly define etendue and a number of related terms and principles. As is well known in the optical arts, etendue expresses the amount of light contained within the product of the cross-sectional area of the source and the solid angle of the emission of the source and relates to the amount of light that can be handled by an optical system. Etendue cannot decrease in an optical system without the loss of light. Within an optical system, etendue is considered with respect to its spatial distribution and its angular distribution. Etendue can be considered as a geometrical property, a product of two factors: spatial area (A) and angle (Ω).

In an optical system, efficient use of light requires matching the etendue of components along the light path so that all of the light is used. For an optical system that is rotationally symmetric throughout, etendue computation and handling considerations are fairly straightforward. Considered in cross-section, taken at a plane that is orthogonal to the central axis of a rotationally symmetric light beam, that is, taken in the plane perpendicular to the propagation direction, the beam is circular with such a system and the optical invariant considered in any direction within the plane is the same. Etendue-matching for components within such an optical system then becomes a problem of simply scaling the spatial and angular extent of the light beam appropriately.

Etendue-matching becomes considerably more complex when the spatial distribution of the light in each axis must be changed in a different way within the optical system. This problem must be addressed, for example, in directing light from a laser diode, with its highly asymmetric etendue characteristics, into an optical fiber that is highly symmetric with respect to etendue.

As was noted previously in the background section and represented in FIG. 1A, for laser diodes that are used for laser pump light, the etendue of the solid-state laser diode is markedly asymmetric. FIG. 1A shows, in schematic form, the output from a typical multi-mode laser diode. The laser has a spatial distribution 122, shown as it would appear at the laser output coupler, and an angular distribution 22, shown for the emitted light.

To facilitate description in the context of the present disclosure, the term "optical invariant" is used when describing etendue with respect to a single direction. With reference to a representative spatial distribution 102 and corresponding angular distribution 104 of a light beam in FIG. 1B, for example, there is an optical invariant $\mathcal{L}$ in each of the two mutually orthogonal directions shown. With reference to FIG. 1B, there is an optical invariant $\mathcal{L}_s$ along a slow axis (SA):

$$\mathcal{L}_s = (l_s \cdot \omega_s)$$

wherein ($l_s$) is the width dimension of the spatial distribution in the slow axis direction and ($\omega_s$) is the divergence angle of the light beam, taken in the slow axis direction. There is a different optical invariant $\mathcal{L}_f$ along the fast axis (FA):

$$\mathcal{L}_f = (l_f \cdot \omega_f)$$

wherein ($l_f$) is the height dimension of the spatial distribution in the fast axis direction and ($\omega_f$) is the divergence angle taken in that direction.

The total etendue E for this light beam from a given light source can be considered as the product:

$$E = (\mathcal{L}_s \cdot \mathcal{L}_f).$$

In the context of the present disclosure, the "aspect ratio of the etendue", denoted R herein, is the quotient:

$$R = (\mathcal{L}_s \cdot \mathcal{L}_f)$$

Equivalently, $$R = (l_s \cdot \omega_s)/(l_f \cdot \omega_f)$$

It can be noted that, for a light beam that is rotationally symmetric, the aspect ratio of the etendue R=1. Embodiments of the present invention address the difficulties encountered when the aspect ratio of the etendue R is other than 1 for an emitted light beam, and where the aspect ratio of the etendue R is substantially 1 for an optical fiber or other optical component to which the light beam is directed.

It must further be observed that a lens cannot be used to change the aspect ratio of the etendue R. When the light beam is directed through a lens, the aspect ratio of the etendue R remains constant. This applies for spherical lenses (lenses having power in both dimensions) and cylindrical lenses (lenses having power in only one dimension) as well. FIG. 1C shows, in schematic form, what happens when a cylindrical lens is used to reduce the spatial distribution along dimension ($l_s$). The resulting spatial distribution 102' shows dimension ($l_s$) reduced from that in FIG. 1B; however, the corresponding angular distribution 104' shows the angular extent increased in a corresponding manner. When a cylindrical lens is used, the aspect ratio of the etendue R is preserved; that is:

$$R = (l_s \cdot \omega_s)/(l_f \cdot \omega_f) = (l_s' \cdot \omega_s')/(l_f \cdot \omega_f)$$

Embodiments of the present invention address the need to change the aspect ratio of the etendue R of an individual beam of light from a light source without loss of light. As one benefit, scaling the aspect ratio of the etendue $R_{out}$ of an individual beam of light enables improved adaptation of a light source, such as a laser diode that has a highly asymmetric aspect ratio of the etendue $R_{out}$, to an input, such as an optical fiber that has an aspect ratio of the etendue $R_{out}$ that is highly symmetrical.

As has been noted, the laser diode characteristically has a significantly larger optical invariant $\mathcal{L}_s$ along its longer slow axis (SA) direction, so that its optical invariant along that axis generally comes close to, or even exceeds, that of the optical fiber. The laser diode has a small optical invariant $\mathcal{L}_f$ along its narrower fast axis (FA) direction, which is often a single spatial mode. This is characterized by a small spatial dimension, as shown in FIG. 1A as spatial distribution 122, and a large (or fast) angular spread. Emission in the slow axis (SA), on the other hand, with diode width D1, contains a number of spatial modes. SA emission typically has a much larger spatial distribution and a small (slow) angular spread. This light must typically be coupled into an optical fiber or other optical system that works best with rotationally symmetric light. Unlike the laser output shown in FIG. 1A, the etendue of the optical fiber, with a circular aperture of the fiber core and a rotationally symmetric numerical aperture, is symmetric, making it difficult to use light generated from laser diodes efficiently.

By way of example, and not of limitation, typical nominal values for pump laser design include the following:

Optical fiber diameter: 105 μm

Optical fiber numerical aperture: 0.15

Optical fiber optical invariant in each axis proportional to: 0.15×0.105 mm*rad=0.01575 mm*rad Laser source optical invariant $\mathcal{L}_s$ (along the slow axis): about 0.015 mm*rad Laser source optical invariant $\mathcal{L}_f$ (along the fast axis): about 0.0014 mm*rad Since the optical invariant $\mathcal{L}_f$ of the laser in the fast axis is so much smaller than the fiber invariant, there is plenty of room to capture the light along that axis. In the example computations shown above, the slow axis optical invariant $\mathcal{L}_s$ exceeds the fast axis optical invariant $\mathcal{L}_f$ by more than a factor of 10. The optical invariant $\mathcal{L}_s$ of the laser in the slow axis is very close to the invariant of the fiber, making alignment in that direction more difficult.

Figure 2B:
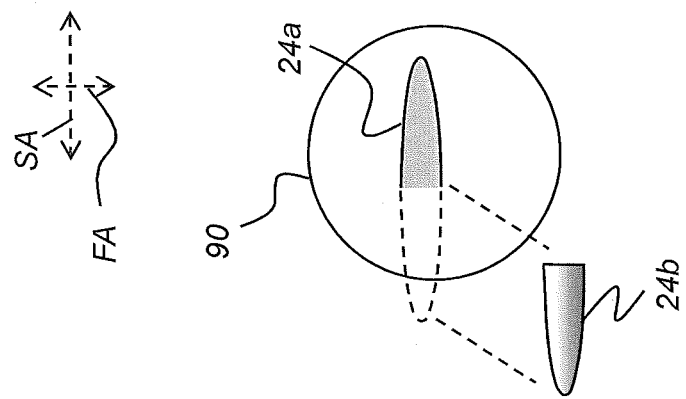
FIGS. 2A, 2B, and 2C show, in schematic form, a sequence for redistributing the light of the laser output beam to provide an aspect ratio of the etendue that is more symmetric than that of the original emitted beam.
Figure 2A:
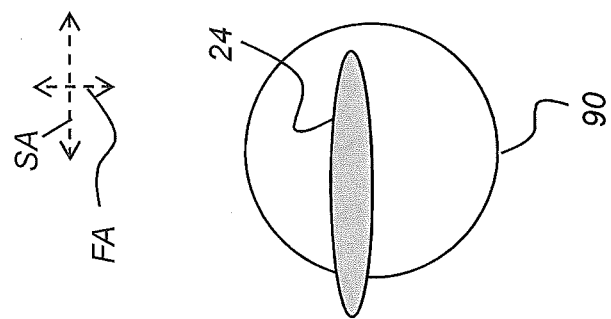
Figure 2C:
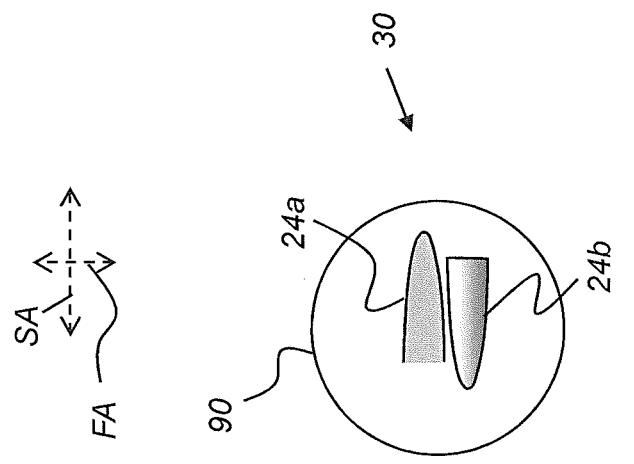

FIGS. 2A, 2B, and 2C show, in schematic form and exaggerated to show basic principles, the light-handling sequence by which the output beam of a laser diode is redistributed according to an embodiment of the present invention, rearranged so that the aspect ratio of the etendue is more symmetric than the original beam. The input pupil 90 of a lens that focuses into an optical fiber core is represented as a circle in these figures. The emitted beam 24 is represented according to its spatial distribution. In FIG. 2A, the distribution of the light beam, expressed by its optical invariant along the slow axis (SA) direction, exceeds the optical invariant of the input pupil 90 and of the optical fiber.

Without some type of correction, there is loss of some amount of light in the SA direction. FIG. 2B shows the output beam split into two segments or portions 24a and 24b. Portion 24a continues along the same optical path as the original light beam shown in FIG. 2A; portion 24b is redirected. FIG. 2C shows a reconstructed output beam 30 that is formed by rearranging portions 24a and 24b, so that they are stacked with respect to the FA direction, vertically as represented in FIG. 2C.

In terms of etendue, the rearrangement provided in FIG. 2C, by splitting the light into two portions, changes the spatial distribution of the light and enables the optical invariant of the output beam in the SA direction to be as little as ½ of the optical invariant of the original emitted output beam shown in FIG. 2A. The optical invariant of the output beam in the orthogonal FA direction is then at least twice that of the original output beam. This changes the aspect ratio of the etendue, providing an output beam that more closely approximates a symmetric beam and allows more efficient use of light from the laser diode.

Figure 3:
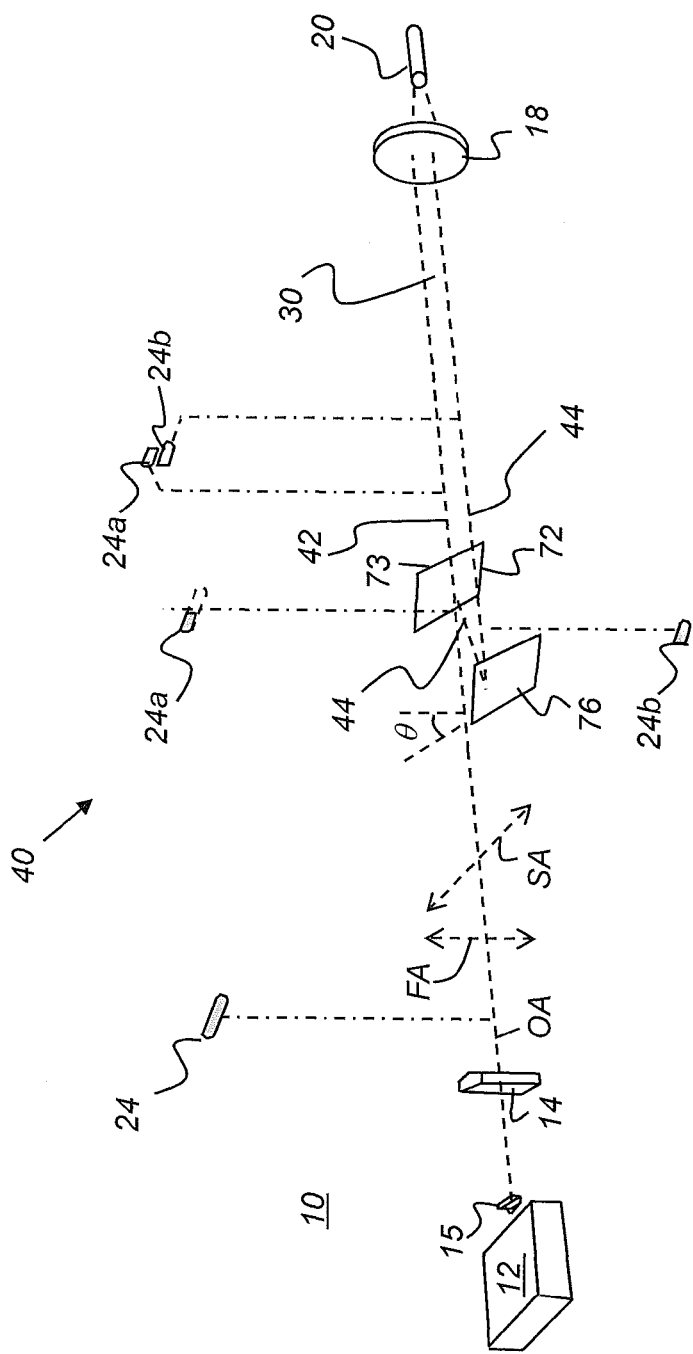
FIG. 3 is a perspective schematic view showing components of an optical apparatus for scaling the aspect ratio of the etendue for a single laser beam.
Figure 4:
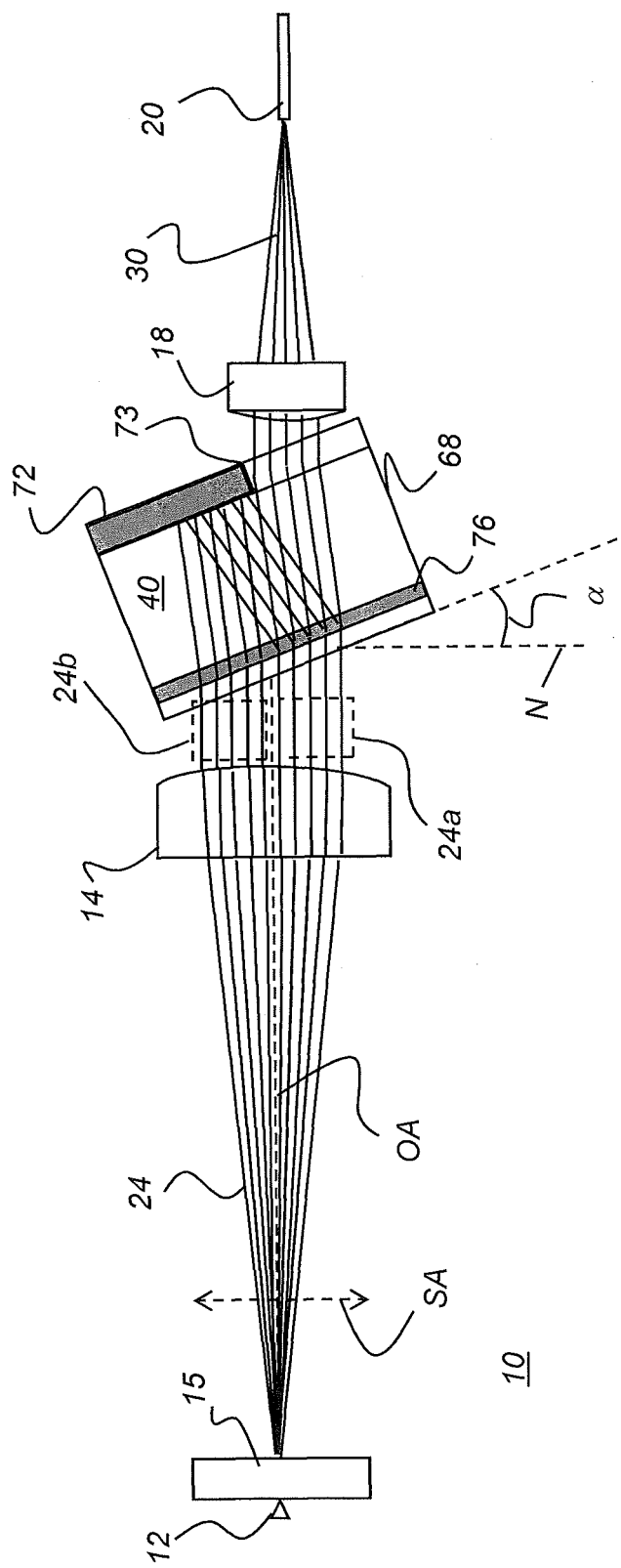
FIG. 4 is a schematic top view of the components of the optical apparatus for etendue scaling.

The perspective view of FIG. 3 and top plan view of FIG. 4 show the arrangement of components that are used to scale the aspect ratio of the etendue as part of a laser pump module 10 according to the sequence shown in FIGS. 2A-2C. In an etendue aspect ratio scaler 40, a solid-state laser 12 is energizable to emit, along an optical axis OA and through cylindrical lenses 15 and 14, input laser light beam 24 that has a first aspect ratio of etendue $R_1$, computed as previously described. Cylindrical lens 15 provides collimation along the fast axis FA. Cylindrical lens 14 provides collimation along the slow axis SA, orthogonal to FA, as shown previously with reference to FIG. 1A. A bisecting reflective surface 72 is oblique to optical axis OA, considered with respect to the plane that contains optical axis OA and slow axis SA, that is, the plane of the page of FIG. 4. Bisecting reflective surface 72 has an edge 73 that is disposed along the optical axis and that bisects the emitted laser light beam, with respect to the SA direction, into two portions 24a and 24b, each portion directed along a separate beam path, shown as undeviated and deviated beam paths 42 and 44. Undeviated beam path 42 continues along axis OA; deviated beam path 44 is reflected and thus diverted to a reflective surface 76, also oblique to the optical axis OA considered in the plan view of FIG. 4. With the single laser light beam bisected in this way, the undeviated and deviated beam paths, 42 and 44 respectively, each contain collimated emitted light from solid-state laser 12. Incident oblique angle α is shown relative to a normal N to the optical axis OA or propagation direction in the plan view of FIG. 4. Normal N lies in the plane defined by OA and SA axes (the plane of the page in FIG. 4).

FIGS. 3 and 4 show portion 24b directed along deviated beam path 44 to folding reflective surface 76 that folds the deviated beam path 44 and directs portion 24b light back in the direction of light along undeviated beam path 42 to form an output beam 30. The redirected portion of deviated beam path 44 that has been reflected from surface 76 is optically parallel to undeviated beam path 42, but redirected deviated beam path 44 is slightly shifted or translated from undeviated beam path 42 with respect to axis FA. The combined portions 24a and 24b, traveling along optically parallel paths following reflection of redirected deviated beam path 44 from surface 76, form output beam 30, with the aspect ratio of etendue scaled as noted previously. A lens 18 then directs output beam 30 along an output beam path to an optical fiber 20.

In addition to the oblique angle α when considered in the plane that contains optical axis OA and the slow axis SA, there is a further non-zero tilt angle θ of reflective surfaces 72 and 76 relative to the plane that contains the optical axis OA and the fast axis FA, wherein the tilt angle may or may not be oblique as defined previously. This angle of tilt, exaggerated as angle θ for better visibility in FIG. 3, skews surfaces 72 and 76 away from normal (orthogonal) to the plane that contains optical axis OA and slow axis SA. The needed angle of tilt depends on factors such as the distance between surfaces 72 and 76 and the gap distance provided between segmented portions that form the output beam. Tilt angle θ and angle adjustment are described in more detail subsequently.

Advantageously, the use of etendue aspect ratio scaler 40 enables the use of a single laser diode as the excitation source in pump module 10. A laser diode extended in its width dimension can be efficiently used with scaler 40, without over-filling the input aperture of the optical fiber.

Although shown in FIGS. 3 and 4 as part of pump module 10, etendue aspect ratio scaler 40 can be used to condition the laser diode output beam for input to other types of optical apparatus that work best with light that is symmetrically distributed relative to a propagation axis.

Embodiments of the present invention can be beneficial in applications wherein the aspect ratio of the etendue of the laser light source is asymmetric, such as when the slow axis optical invariant $\mathcal{L}_s$ exceeds the fast axis optical invariant $\mathcal{L}_f$ by at least about a factor of 2. Alternately considered, embodiments of the present invention are generally more advantageous when the optical invariant with respect to a first direction is less than half the optical invariant with respect to a second direction that is orthogonal to the first direction; this benefit tends to increase with an increase in the difference between the optical invariants in orthogonal directions. For laser pump light applications, for example, embodiments of the present invention can be advantageous where the optical invariant of the input laser light beam with respect to the FA direction can be less than ½, ⅓, ¼, or even less than one tenth of the optical invariant of the input laser light beam with respect to the SA direction. Using etendue aspect ratio scaler 40 of embodiments of the present invention, the optical invariant of the output beam 30 with respect to the fast axis direction is typically at least about twice the optical invariant of the input laser light beam with respect to the fast axis direction.

Reflective surfaces 72 and 76 can be reflective elements such as mirrors, mounted in parallel and precisely positioned for tilt and oblique angle with respect to laser 12 output. In the embodiment of FIG. 4, reflective surfaces 72 and 76 are formed on opposing surfaces of a transparent block, a refractive body 68. The use of thin-film coatings for reflective surfaces 72 and 76 helps in reducing scatter and other effects and allows a very sharp edge to be presented to incoming light beams incident along edge 73.

As noted previously, lasers having extended emitter stripe width have been developed, but are of limited commercial value for use with optical fiber because of excessively high asymmetry of the output beam. For such lasers, it can be advantageous to segment the emitted laser beam into even more than two portions, extending the sequence described previously with respect to FIGS. 2A-2C. The perspective view of FIG. 5 and top view schematic of FIG. 6 show etendue aspect ratio scaler 40 designed to handle a wider laser beam 124 having an optical invariant along the slow axis SA that can even exceed twice the optical invariant of an optical fiber, and to provide a corresponding output beam 30 with more than two stacked portions. As is shown in these figures, portions of laser beam 124 undergo multiple reflections between reflective surfaces 72 and 76.

Figure 7B:
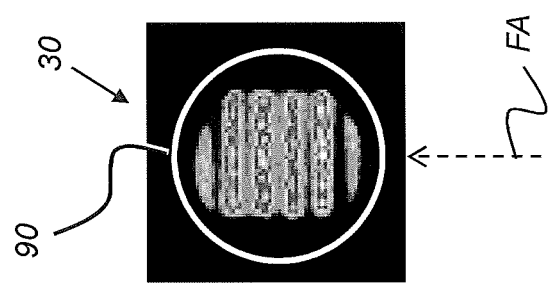
FIG. 7B shows an output beam 30 that is formed from the emitted light initially having the beam profile shown in FIG. 7A.
Figure 7A:
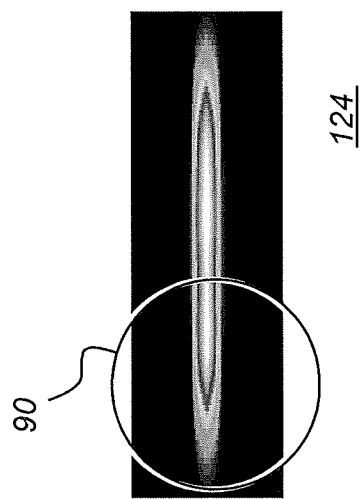
FIG. 7A shows a spatial profile of an emitted laser beam that exceeds the symmetric input aperture of an optical fiber or other spherical optics system.

By way of example, FIG. 7A shows a spatial profile of an emitted laser beam that exceeds the symmetric input aperture of an optical fiber or other rotationally symmetric optics system; the input pupil 90 of a typical lens for focusing light into an optical fiber is superimposed on FIG. 7A for reference. FIG. 7B shows an output beam 30 that is formed from the emitted light having the beam profile shown in FIG. 7A, using etendue aspect ratio scaler 40 according to an embodiment of the present invention. As FIG. 7B shows, output beam 30 is formed by dividing and rearranging beam 124 into multiple portions; six portions are in the example shown. The portions are aligned along the fast axis.

The sequence given in FIGS. 8A, 8B, 8C, 8D, 8E, and 8F show, in schematic form with a top view of scaler 40 and other optical components and a plan view of input pupil 90, how each portion of the output beam is arranged. FIG. 8A is a top schematic view that shows how a first portion 124a of emitted laser beam 124 is split from the balance of the beam and follows in undeviated beam path 42. For this example, portion 124a includes about one-sixth of emitted beam 124, taken from the right edge of the beam. FIG. 8B then shows how a second portion 124b is segmented or sectioned off from beam 124. Portion 124b is initially incident on bisecting reflective surface 72 and is directed along a deviated beam path toward reflective surface 76. Reflective surface 76 redirects this light back toward reflective surface 72. After one cycle of reflection from reflective surface 72 and from reflective surface 76, the light from portion 124b is now on a beam path that is optically parallel with and, with respect to the FA direction as described previously, slightly displaced from the path of light taken by portion 124a, and passes edge 73 to form the output beam.

FIG. 8C shows how a third portion 124c is segmented or sectioned off from beam 124. Portion 124c is initially incident on bisecting reflective surface 72 and is directed along a deviated beam path toward reflective surface 76. Reflective surface 76 redirects this light back toward reflective surface 72. After two cycles of reflection from reflective surface 72 and reflective surface 76, the light from portion 124c is now on a beam path that is optically parallel with and, with respect to the FA direction as described previously, slightly displaced from the path of light taken by portion 124b, and passes edge 73 to form the output beam.

FIGS. 8D, 8E, and 8F show how successive beam portions 124d, 124e, and 124f, respectively, are each split and redirected following the basic pattern described for portions 124b and 124c. Each of beam portions 124d, 124e, and 124f are split from beam 124, reflected between surfaces 72 and 76 in three, four, and five reflection cycles, respectively, and finally redirected to be optically parallel to the undeviated beam portion 124a to form the output beam. As the sequence of FIGS. 8A through 8F shows, each successive beam portion is displaced from the previous portion in the fast axis (FA) direction, which is the vertical direction as represented looking into input pupil 90 as it is represented in these figures.

As the example shown in the FIG. 8A-8F sequence illustrates, etendue aspect ratio scaler 40 can segment output beam 124 into two or more portions and stack the segmented portions, with respect to the fast axis FA, to change the aspect ratio of the etendue and to more efficiently direct light to a rotationally symmetric input aperture. In general, it can be seen that at least a portion of the deviated redirected beam passes edge 73 to become output beam 30. For the embodiment described with reference to FIGS. 2A-2C, 3, and 4, this redirected portion contains all of the remaining light in the emitted beam following a single reflection cycle. For the embodiment of FIGS. 8A-8E, on the other hand, some portion of the deviated redirected beam is reflected one or more additional times. It should also be noted that the same etendue aspect ratio scaler 40 can be used for emitted beams of various widths.

Reflective surfaces 72 and 76 are not disposed so that they are orthogonal or normal to the plane that contains optical axis OA and slow axis SA. As was noted previously with respect to FIG. 3, there is at least some slight, nonzero tilt angle of bisecting and folding reflective surfaces 72 and 76 with respect to a normal to this plane.

Figure 9:
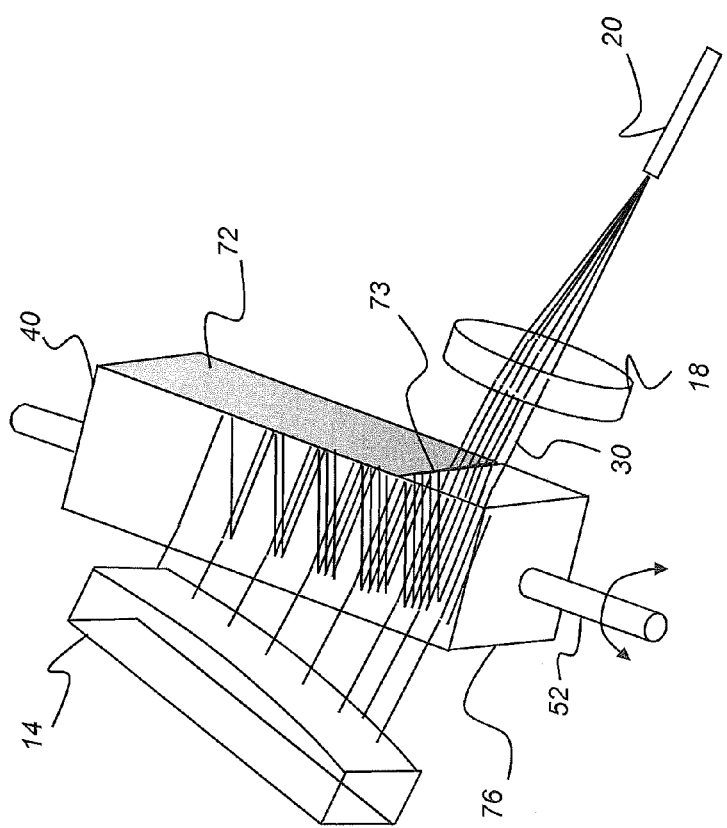
FIG. 9 is a perspective view that shows a tilt adjusting element that allows a gap adjustment according to an alternate embodiment of the present invention.

According to a further embodiment of the present invention, as shown in FIG. 9, a tilt adjusting element 52, enables tilt to be adjusted over a range of angular values, affecting the spacing between beam portions, with respect to the fast axis, to be adjustable over a range of gap distances. Tilt adjustment effectively adjusts the displacement of each redirected deviated beam path from the undeviated beam path with respect to the fast axis direction.

The side view schematic diagram of FIG. 10A shows tilt adjustment at a first tilt angle θ1. FIG. 10B shows the corresponding arrangement of output beam 30, as viewed from input pupil 90, with a gap 126 between beam portions, shown between beam portions 124c and 124d in FIGS. 10A and 10B. A reference line L1 is orthogonal to the optical axis OA, normal to the plane that contains axes OA and SA, and parallel to the plane that contains axes OA and FA.

Figures 11A, 11B:
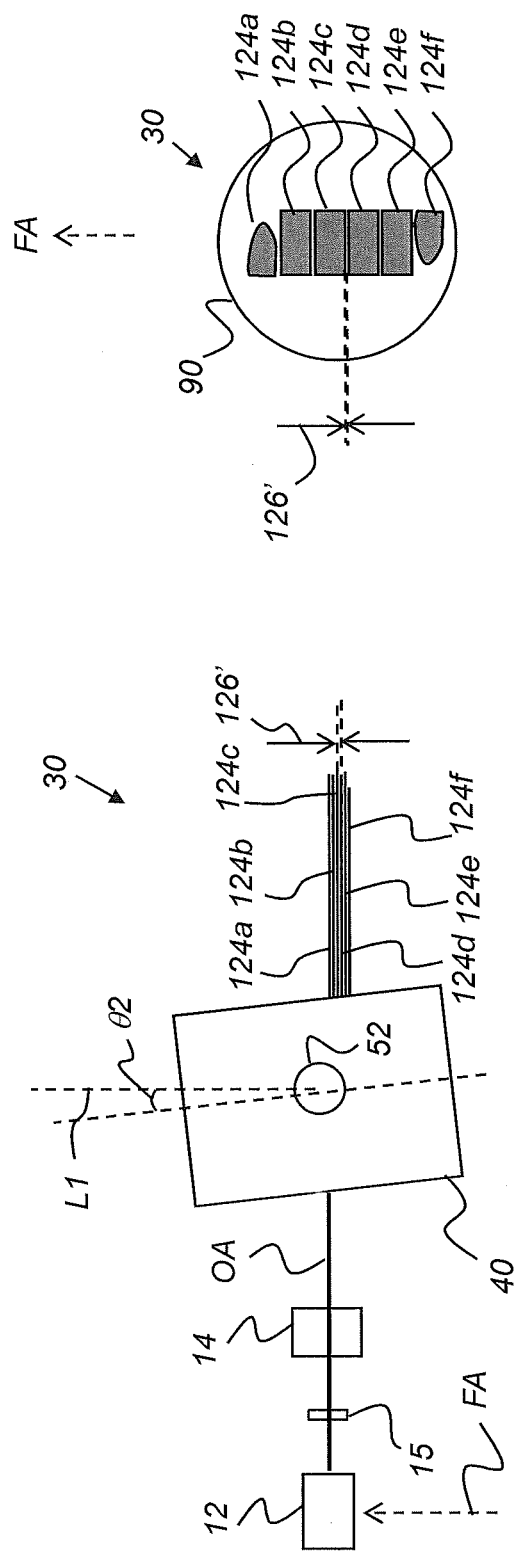
FIG. 11A is a side view schematic diagram that shows a tilt position for a narrower gap distance than is shown in FIGS. 10A and 10B.
FIG. 11B is a plan view of an output beam with the gap distance in the example of FIG. 11A.

FIGS. 11A and 11B show the effect of tilt adjustment to a second tilt angle θ2. Beam portions are now spaced closer together in output beam 30, with a gap 126' that is less than gap 126 for tilt angle θ1 in FIGS. 10A and 10B. Using this optional mechanism allows a measure of adjustability for the aspect ratio of the etendue that is achieved using etendue aspect ratio scaler 40. Tilt adjusting element 52 can be manually adjusted or adjusted using a motor or other actuator, for example. Tilt angles θ1 and θ2 may or may not be oblique to the propagation direction, as the term "oblique" is used herein. For example, tilt angles of 1.5 degrees or less may be practical for some embodiments of the present invention, disposing reflective surfaces 72 and 76 at suitable tilt positions for beam etendue adjustment, as described herein.

Fabrication

Figure 5:
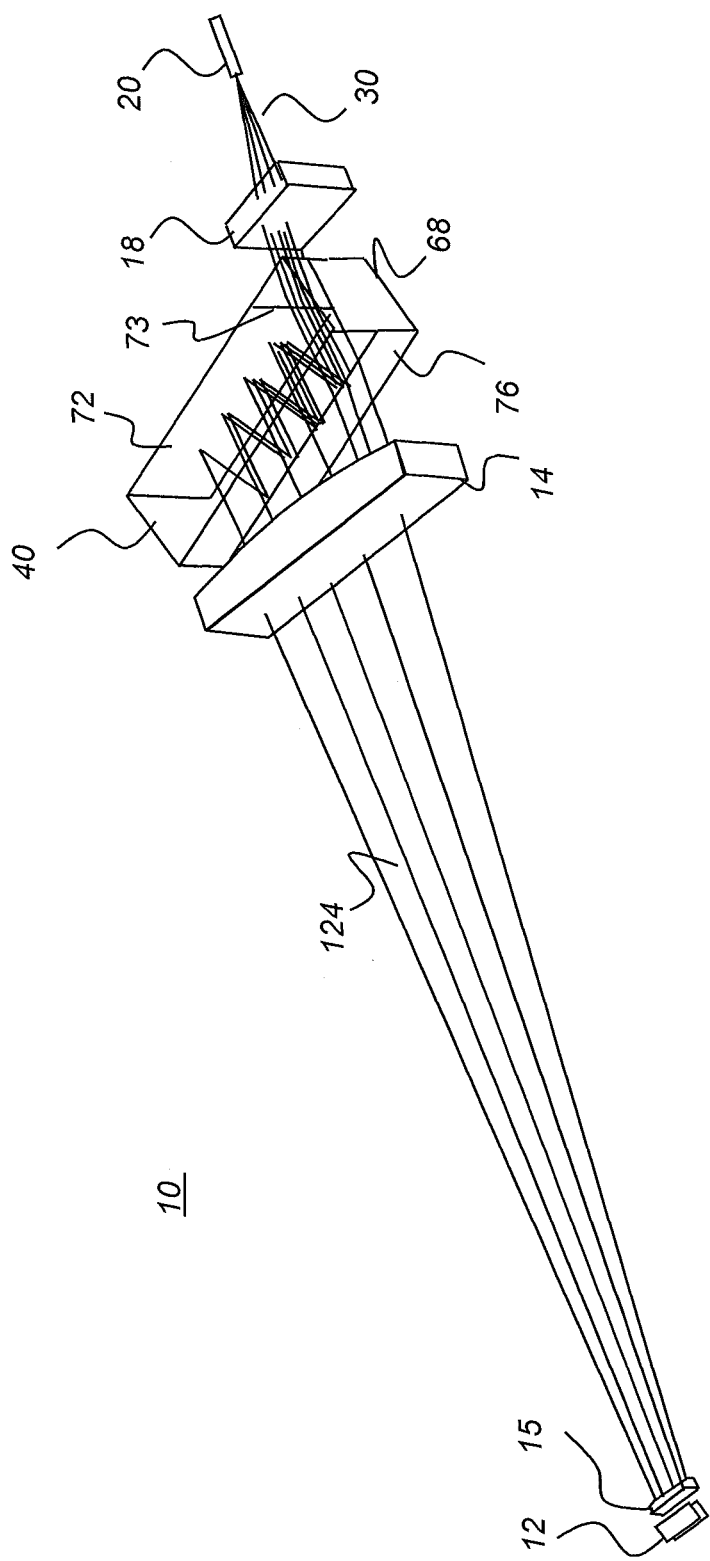
FIG. 5 is a perspective view of an apparatus for providing a light beam having a scaled etendue aspect ratio according to an embodiment of the present invention.
Figure 6:
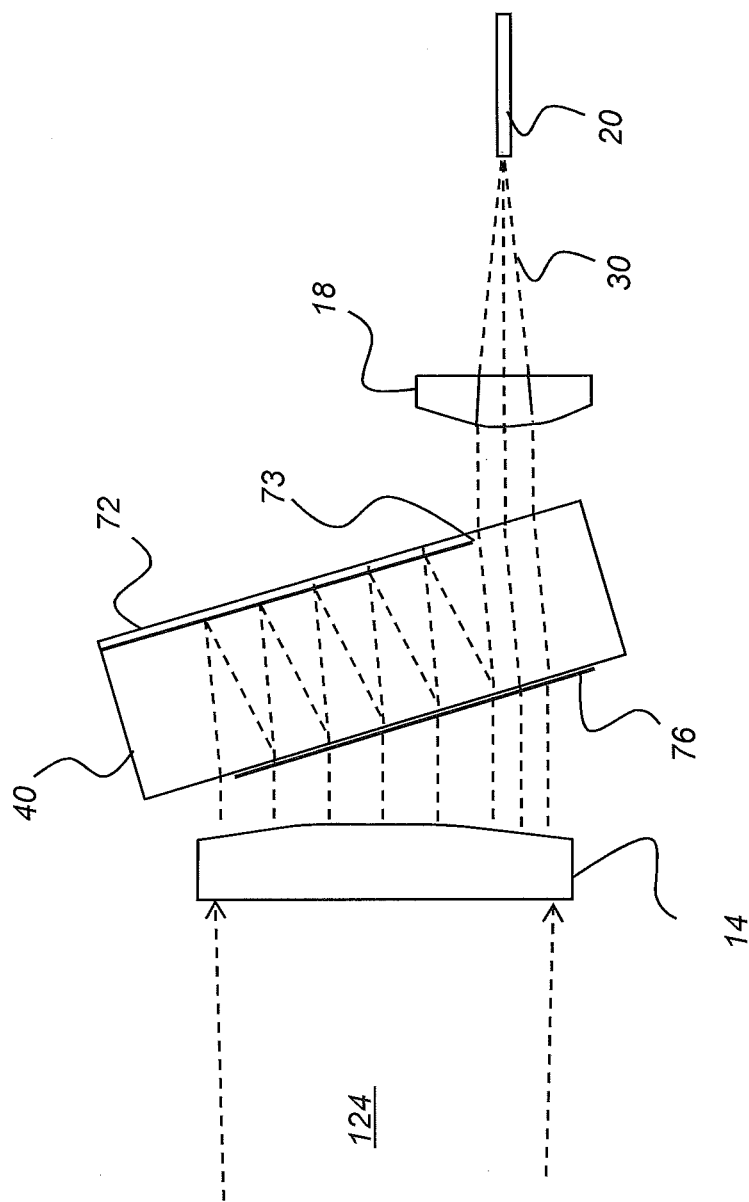
FIG. 6 is a top view of the apparatus of FIG. 5, showing light paths for a light beam that is separated into more than two segments.

Transparent refractive body 68, shown for example in FIGS. 4 and 5, is typically a glass plate, selected for suitability with the intended laser wavelengths. Other transparent materials can be used, including crystalline materials and plastics, for example. Conventional mounting techniques can be used to position components of etendue aspect ratio scaler 40 at suitable oblique in-plane angles α with respect to the emitted laser beam, as was described earlier with reference to FIG. 4. In-plane incident angle α is determined by the index of refraction n of the selected glass or other transparent block of material used for refractive body 68 or other transparent body. Tilt angle θ1 is similarly a function of index of refraction, desired gap distance, and distance between reflective surfaces 72 and 76.

Thin film coatings on opposite surfaces of transparent body 68 are advantaged for beam bisection or splitting and redirection, reducing diffraction and other unwanted effects over other reflective device solutions. The use of transparent body 68 also simplifies alignment and eliminates the need to separately position the coated surfaces.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention. The invention is defined by the claims.

Thus, what is provided is an apparatus and method for allowing adjustment of the aspect ratio of the etendue of a laser light beam.

The invention claimed is:

1. An apparatus for providing a light beam comprising:
   a) a solid-state laser that is energizable to emit, along an optical axis, an input laser light beam that has a first aspect ratio of etendue $R_1$, wherein the optical invariant of the input laser light beam with respect to a first direction is less than half the optical invariant of the input laser light beam with respect to a second direction that is orthogonal to the first direction;
   b) a first cylindrical lens that is disposed to collimate the input laser light beam with respect to the first direction;
   c) a second cylindrical lens that is disposed to collimate the input laser light beam with respect to the second direction;
   d) a bisecting reflective surface having an edge that extends along the first direction and that is disposed along the optical axis to split the collimated laser light beam, with respect to the second direction, into an undeviated beam path from light on one side of the edge, and a first deviated beam path from light on the other side of the edge, wherein the undeviated and first deviated beam paths each contain emitted light from the solid-state laser; and
   e) a folding reflective surface disposed to redirect the first deviated beam path back toward the bisecting reflective surface, so that the redirected first deviated beam path is optically parallel with the undeviated beam path and is displaced from the undeviated beam path with respect to the first direction,
   wherein at least a first portion of the redirected first deviated beam path passes the edge and combines with the undeviated beam path to form an output beam having a second aspect ratio of etendue $R_2$ that is not equal to $R_1$.

2. The apparatus of claim 1 wherein the folding reflective surface is further disposed to redirect a second portion of the redirected first deviated beam path to the bisecting reflective surface, forming a second deviated beam path that is optically parallel with the first deviated beam path and, with respect to the first direction, is offset from the first deviated beam path.

3. The apparatus of claim 1 wherein the optical invariant of the input laser light beam with respect to the first direction is less than one fourth of the optical invariant of the input laser light beam with respect to the second direction.

4. The apparatus of claim 1 wherein the bisecting reflective surface and folding reflective surface are both formed on opposite surfaces of a transparent body.

5. The apparatus of claim 1 wherein the bisecting reflective surface and folding reflective surfaces are in parallel planes.

6. The apparatus of claim 1 further comprising a rotationally symmetric lens disposed to direct the output beam toward an optical fiber.

7. The apparatus of claim 6 wherein the optical invariant of the solid-state laser with respect to the second direction exceeds the optical invariant of the optical fiber.

8. The apparatus of claim 1 wherein the bisecting reflective surface is formed as a thin film coating and wherein the bisecting reflective surface is disposed at an oblique angle with respect to a normal to the optical axis, wherein the normal lies in a plane that extends in the second direction and includes the optical axis.

9. The apparatus of claim 4 further comprising a tilt adjusting element that is coupled to the transparent body and defines a tilt axis and wherein rotation about the tilt axis adjusts the displacement in the output beam at least between the redirected first deviated beam path and the undeviated beam path with respect to the first direction.

10. An apparatus for providing a light beam comprising:
    a) a solid-state laser that is energizable to emit, along an optical axis, an input laser light beam that has a first aspect ratio of etendue $R_1$, wherein the optical invariant of the input laser light beam with respect to a first direction is less than half the optical invariant of the input laser light beam with respect to a second direction that is orthogonal to the first direction;
    b) a first cylindrical lens that is disposed to collimate the input laser light beam with respect to the first direction;
    c) a second cylindrical lens that is disposed to collimate the input laser light beam with respect to the second direction;
    d) a bisecting reflective surface on one side of a transparent block of material, the bisecting reflective surface having an edge that is disposed along the optical axis to split the collimated laser light beam, with respect to the second direction, into an undeviated beam path from light on one side of the edge, and a first deviated beam path from light on the other side of the edge, wherein the undeviated and first deviated beam paths each contain emitted light from the solid-state laser; and
    e) a folding reflective surface on an opposite side of the transparent block of material and disposed to redirect the first deviated beam path back toward the bisecting reflective surface, so that the redirected first deviated beam path is optically parallel with the undeviated beam path and is displaced from the undeviated beam path with respect to the first direction,
    wherein at least a first portion of the redirected first deviated beam path passes the edge and combines with the undeviated beam path to form an output beam having a second aspect ratio of etendue $R_2$ that is not equal to $R_1$.

11. The apparatus of claim 10 wherein the bisecting reflective surface and folding reflective surfaces are in parallel planes.

12. The apparatus of claim 10 further comprising a rotationally symmetric lens disposed to direct the output beam toward an optical fiber.

13. The apparatus of claim 12 wherein the optical invariant of the solid-state laser with respect to the second direction exceeds the optical invariant of the optical fiber.

14. The apparatus of claim 10 wherein the bisecting reflective surface is formed as a thin film coating and wherein the bisecting reflective surface is disposed at an oblique angle with respect to a normal to the optical axis, wherein the normal lies in a plane that extends in the second direction and includes the optical axis.

15. The apparatus of claim 10 further comprising a tilt adjusting element that is coupled to the transparent block and defines a tilt axis and wherein rotation about the tilt axis adjusts the displacement in the output beam between at least the redirected deviated beam path and the undeviated beam path with respect to the first direction.

16. A method for providing light to an optical fiber, the method comprising:
   a) energizing a solid-state laser to emit light along an optical axis, wherein the light beam has a first aspect ratio of etendue $R_1$, wherein the optical invariant of the input laser light beam with respect to a first direction is less than half the optical invariant of the input laser light beam with respect to a second direction that is orthogonal to the first direction;
   b) collimating the input laser light beam with respect to the first direction through a first cylindrical lens;
   c) collimating the input laser light beam with respect to the second direction through a second cylindrical lens;
   d) directing the collimated laser light beam toward a bisecting reflective surface having an edge that is disposed along the optical axis to split the collimated laser light beam, with respect to the second direction, into an undeviated beam path from light on one side of the edge, and a deviated beam path from light on the other side of the edge, wherein the undeviated and deviated beam paths each contain emitted light from the solid-state laser; and
   e) forming an output beam having a second aspect ratio of etendue $R_2$ that is not equal to $R_1$ by disposing a folding reflective surface to redirect the deviated beam path back toward the bisecting reflective surface, so that the redirected deviated beam path is optically parallel with the undeviated beam path and is displaced from the undeviated beam path with respect to the first direction.

17. The method of claim 16 wherein a first portion of the redirected deviated beam path passes the edge of the bisecting reflective surface and a second portion of the redirected deviated beam path is again split by the bisecting reflective surface and is redirected back toward the folding reflective surface.

18. The method of claim 16 further comprising providing a tilt adjustment to adjust the displacement of the redirected deviated beam path from the undeviated beam path with respect to the first direction.

19. The apparatus of claim 16 further comprising directing the output beam toward an optical fiber through a rotationally symmetric lens.

20. The apparatus of claim 16 wherein the bisecting and folding reflective surfaces are formed on opposite sides of a transparent block of material.

* * * * *